United States Patent
Sahlman et al.

(10) Patent No.: US 9,571,036 B2
(45) Date of Patent: Feb. 14, 2017

(54) HETERODYNE RECEIVER STRUCTURE, MULTI CHIP MODULE, MULTI INTEGRATED CIRCUIT MODULE, AND METHOD FOR PROCESSING A RADIO FREQUENCY SIGNAL

(75) Inventors: Karl-Gösta Sahlman, Sollentuna (SE); Tomas Lieback, Mölnlycke (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 701 days.

(21) Appl. No.: 13/496,234

(22) PCT Filed: Feb. 7, 2012

(86) PCT No.: PCT/SE2012/050115
§ 371 (c)(1),
(2), (4) Date: Mar. 15, 2012

(87) PCT Pub. No.: WO2013/085450
PCT Pub. Date: Jun. 13, 2013

(65) Prior Publication Data
US 2013/0202067 A1    Aug. 8, 2013

Related U.S. Application Data

(60) Provisional application No. 61/567,814, filed on Dec. 7, 2011.

(51) Int. Cl.
*H04B 1/10* (2006.01)
*H03D 7/18* (2006.01)
(Continued)

(52) U.S. Cl.
CPC ............. *H03D 7/18* (2013.01); *H04B 1/06* (2013.01); *H04B 1/0021* (2013.01); *H04B 1/0046* (2013.01)

(58) Field of Classification Search
None
See application file for complete search history.

(56) References Cited

U.S. PATENT DOCUMENTS

| | | | |
|---|---|---|---|
| 7,062,248 B2 | 6/2006 | Kuiri | |
| 2008/0013654 A1* | 1/2008 | Rick | H03G 3/3068 375/345 |
| 2011/0076977 A1* | 3/2011 | Coban | H03G 3/3068 455/234.2 |

FOREIGN PATENT DOCUMENTS

| | | | |
|---|---|---|---|
| WO | 9934625 A1 | 7/1999 | |
| WO | 2010121261 A1 | 10/2010 | |
| WO | WO 2010121261 A1 * | 10/2010 | ........... H04B 1/0014 |

OTHER PUBLICATIONS

Daly et al. "A Pulsed UWB Receiver SoC for Insect Motion Control," IEEE Journal of Solid-State Circuits, vol. 45, No. 1, Jan. 2010, pp. 153-166.

(Continued)

*Primary Examiner* — Chieh M Fan
*Assistant Examiner* — Wednel Cadeau
(74) *Attorney, Agent, or Firm* — Patent Portfolio Builders, PLLC (57) ABSTRACT

A heterodyne receiver structure comprises a frequency conversion block arranged to convert an incoming analog radio frequency (RF) signal to an analog intermediate frequency (IF) signal; a filter block arranged to filter said analog IF signal; and an analog-to-digital (AD) converter block arranged to convert said filtered analog IF signal to a digital signal, wherein the AD converter block (309) is arranged to convert the filtered analog IF signal to the digital signal by using a sampling frequency (fs) which is at least N times a maximum bandwidth of the filtered analog IF signal, wherein the frequency spectrum from zero to the sampling frequency is divided into N frequency zones of equal width, (Continued)

wherein N is an even positive number higher than two; the frequency conversion block (304) is arranged to convert the incoming analog RF signal to the analog IF signal such that the analog IF signal is located in any of the N/2-1 frequency zones having lowest frequency; and the filter block (306-308) is arranged to low pass the analog IF signal such that any disturbing signal located in a zone, which would have a mirror image after the AD conversion in the zone, in which the analog IF signal is located, is filtered away, wherein the heterodyne receiver structure further comprises a digital signal processing block (311) arranged to filter said digital signal.

19 Claims, 9 Drawing Sheets

(51) Int. Cl.
  *H04B 1/06* (2006.01)
  *H04B 1/00* (2006.01)

(56) References Cited

OTHER PUBLICATIONS

Hayashi et al. "A 10.8mA Single Chip Transceiver for 430MHz Narrowband Systems in 0.15 um CMOS," IEEE International Solid-State Circuits Conference, Feb. 7, 2006, pp. 1-10.
Kester, Walt, "What the Nyquist Criterion Means to Your Sampled Data System Design," Analog Devices, MT-002 Tutorial, Mar. 4, 2009, pp. 1-12.
Wang et al. "A Single-Chip UHF RFID Reader in 0.18-um CMOS," IEEE 2007 Custom Integrated Circuits Conference, Sep. 2007, pp. 111-114.

* cited by examiner

HETERODYNE RECEIVER STRUCTURE, MULTI CHIP MODULE, MULTI INTEGRATED CIRCUIT MODULE, AND METHOD FOR PROCESSING A RADIO FREQUENCY SIGNAL

TECHNICAL FIELD

The invention relates to heterodyne receiver structures, multi chip and multi integrated circuit modules comprising such structures, and methods for processing radio frequency signals.

BACKGROUND

Figure 1:
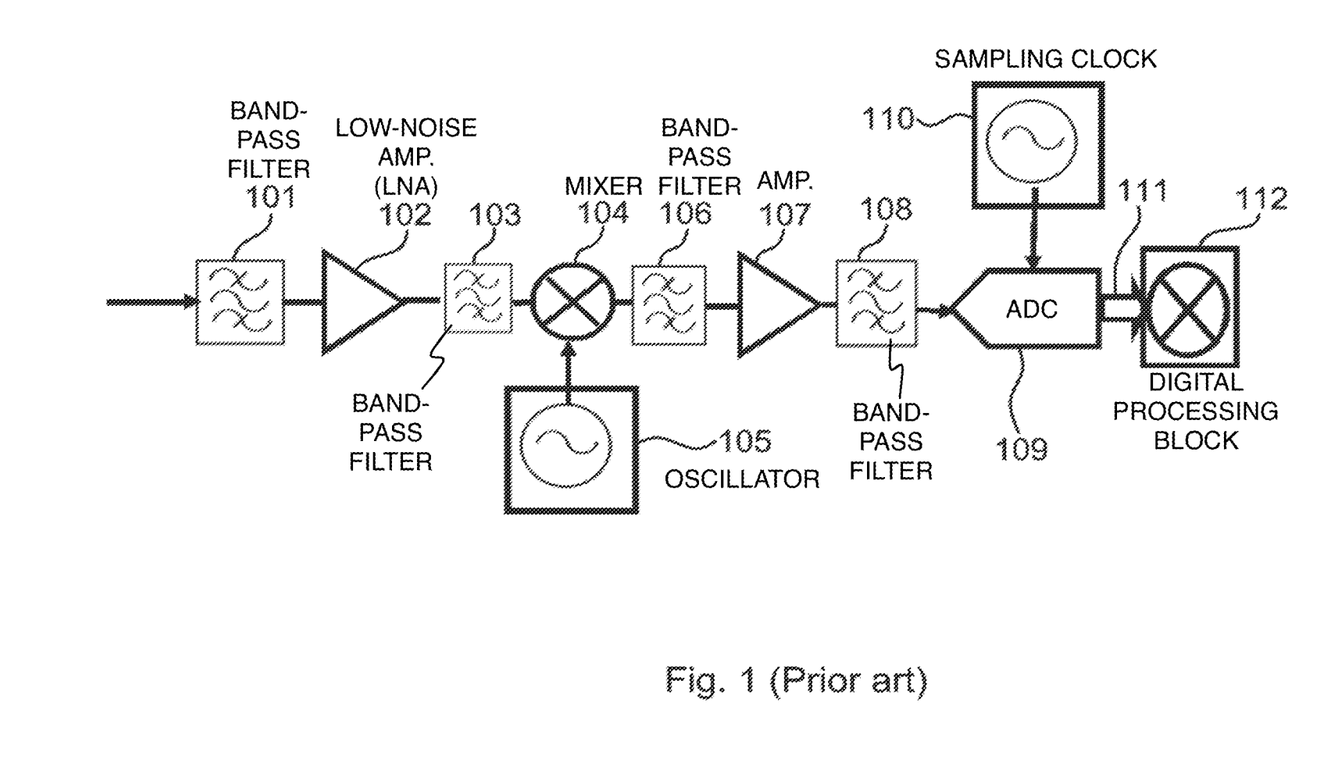
FIG. 1 is a block diagram of a prior art super-heterodyne receiver with single analogue conversion.

FIG. 1 is a block diagram of a prior art super-heterodyne receiver with single analogue conversion. The receiver comprises an antenna band pass filter 101 arranged to filter an incoming analogue radio frequency (RF) signal, a low noise amplifier 102 arranged to amplify the incoming analogue RF signal, a band pass filter 103 acting as an intermediate frequency (IF) image reject filter to filter the amplified analogue RF signal, a frequency conversion block or mixer 104, which by aid of an oscillator 105 that provides the local oscillator frequency, is arranged to down convert the filtered analogue RF signal to an analogue IF signal, a band pass filter block comprising two band pass filter 106, 108 and an amplifier 107 and arranged to band pass filter and amplify the analogue IF signal, an analogue-to-digital (AD) converter 109 driven by a sampling clock 110 and arranged to convert the analogue IF signal to a digital signal 111, and a digital processing block 112 arranged to convert the digital signal to I- and Q-components to access a message in the incoming RF signal.

The receiver of FIG. 1 for a multicarrier receiver application is basically a double conversion receiver where the frequency conversion block 104 converts the analogue RF signal to an analogue IF signal, which is received by the AD converter 109 in one of the AD converter Nyquist zones. The second conversion is made in a digital domain utilizing e.g. a numerical controlled oscillator (NCO) multiplier with complex numbers to convert the output signal from the AD converter 109 to IF=0 to recover the I/Q modulation message in the signal.

The advantage of the super-heterodyne receiver is that no I/Q errors in the down-conversion process is introduced and the I/Q signal is obtained after a numerically controlled down conversion in the digital domain in contrary to the direct down conversion or homodyne principle were analogue modulators will introduce inaccuracies that can make homodyne receivers difficult to apply to multi carrier or multi signal receivers.

Figure 2:
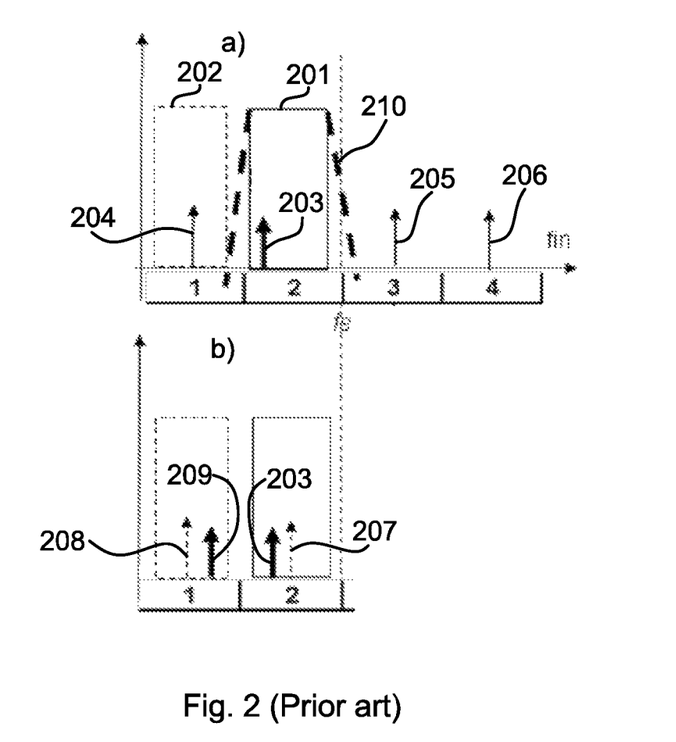
FIGS. 2a-b are Nyquist zone diagrams related to the operation of the receiver of FIG. 1.

FIGS. 2a-b are Nyquist zone diagrams related to the operation of the prior art super-heterodyne receiver utilizing an AD converter 109 with sampling frequency fs. FIG. 2a shows the input signal scenario to the AD converter 109. A part of the second Nyquist zone 201 is selected to be used for the incoming analogue IF signal 203. The Nyquist zone 202 is the mirror zone for the real AD converter output signal digital since the response from the AD converter 109 in the frequency domain is mirrored in the Nyquist frequency fs/2. Signals 204, 205, and 206 are signals in adjacent Nyquist zones of the AD converter 109. FIG. 2b shows the resulting AD converter output scenario. The real AD converter output signal will receive the signal 203 and its real mirror image 209 if the disturbance signals 204, 205, and 206 are filtered away so they do not provide any real signals with mirror images in the AD converter output spectrum. Such disturbing or undesired signals are indicates by reference numerals 207 and 208.

Those parts of the Nyquist zone 201 which contain signals from other Nyquist zones of the AD converter 109 can not be used if not the band pass filtering before the AD converter 109 effectively blocks such signals. Therefore, in order to have as much receiver band width as possible in a Nyquist zone, very high Q band pass filtering has to be applied. The required slopes for such band pass filtering are indicated by 210 in FIG. 2a. Due to that filter problem the usage of a Nyquist zone bandwidth is normally limited to 50-70%.

SUMMARY

The disadvantage of the prior art receiver is that as the filter requirements becomes tougher, the filter becomes harder to design. The band pass filter to be used will introduce loss and pass band loss variations. The component tolerances of the used filter components will also influence the yield. This is a problem that gets worse the larger part of the fs/2 range that is being used for the receiver.

It is an objective of the present disclosure to alleviate the problem with the prior art receiver as disclosed above.

A first aspect is a heterodyne receiver structure comprising a frequency conversion block arranged, by aid of a local oscillator, to convert an incoming analogue radio frequency (RF) signal to an analogue intermediate frequency (IF) signal; a filter block arranged to filter said analogue IF signal; and an analogue-to-digital (AD) converter block arranged, by aid of a sampling clock, to convert said filtered analogue IF signal to a digital signal. The AD converter block is arranged to convert the filtered analogue IF signal to the digital signal by using a sampling frequency which is at least N times a maximum bandwidth of the filtered analogue IF signal, wherein the frequency spectrum from zero to the sampling frequency is divided into N frequency zones of equal width, wherein N is an even positive number higher than two. The frequency conversion block is arranged to convert the incoming analogue RF signal to the analogue IF signal such that the analogue IF signal is located in any of the N/2-1 frequency zones having lowest frequency. The filter block is arranged to low pass the analogue IF signal such that any disturbing signal located in a frequency zone, which would have a mirror image after the AD conversion in the zone, in which the analogue IF signal is located, is filtered away. The heterodyne receiver structure further comprises a digital signal processing block arranged to filter, and to decimate the rate of, the digital signal.

Preferably, the digital signal processing block comprises at least one digital finite impulse response (FIR) filter arranged to filter said digital signal such that disturbing signals located in any of the N frequency zones but the frequency zones, in which the digital signal and its mirror image are located, are filtered away, and at least one signal rate decimation stage arranged to decimate the rate of the digital signal N/2 times. Further, the digital signal processing block may comprise at least one numerically controlled oscillator (NCO) multiplier.

Thus, by means of increasing the sampling frequency N/2 times for the AD converter, the requirements on the filter before the AD converter are strongly reduced. A simple non-tunable low pass filter can be used. Instead, further filtering is performed in the digital signal domain by the digital signal block. Therein, the signal rate is also reduced N/2 times to return to the ordinary signal rate as obtained in the prior art receiver.

The AD converter block may comprise an N/2 times oversampling AD converter, or an interleaved AD converter arrangement. In one embodiment N=8, wherein the frequency conversion block is arranged to convert the incoming analogue RF signal such that the analogue IF signal is located in any of the first to third frequency zones of the eight frequency zones.

Any combination of the above blocks may be integrated into one or more integrated circuits, preferably an application-specific integrated circuit (ASIC). If the filter block comprises a first low pass filter, a second low pass filter, and an amplifier arranged therein between, any of these components may be found in the integrated circuit.

A second aspect is thus an integrated circuit such as an ASIC comprising some or all of the blocks of the receiver structure of the first aspect.

A third aspect is a multi chip module (MCM), or a multi integrated circuit (IC) module, comprising a receiver structure of the first aspect, or an integrated circuit such as an ASIC of the second aspect, together with an RF band pass filter arranged to filter the incoming analogue RF signal, and/or a low noise amplifier arranged to amplify the incoming analogue RF signal, before the frequency conversion block is arranged to convert the incoming analogue RF signal to an analogue IF signal.

A fourth aspect is a method for processing a radio frequency signal comprising the steps of converting an incoming analogue radio frequency (RF) signal to an analogue intermediate frequency (IF) signal; filtering the analogue IF signal; converting the filtered analogue IF signal to a digital signal; and filtering the digital signal and decimating its rate. The filtered analogue IF signal is converted to the digital signal by using a sampling frequency which is at least N times a maximum bandwidth of the filtered analogue IF signal, wherein the frequency spectrum from zero to the sampling frequency is divided into N frequency zones of equal width, wherein N is an even positive number higher than two. The incoming analogue RF signal is converted to the analogue IF signal such that the analogue IF signal is located in any of the N/2-1 frequency zones having lowest frequency. The analogue IF signal is low pass filtered such that any disturbing signal located in a frequency zone, which would have a mirror image after the AD conversion in the frequency zone, in which the analogue IF signal is located, is filtered away. Finally, the digital signal is filtered, preferably such that disturbing signals located in any of the N frequency zones but the frequency zones, in which the digital signal and its mirror image are located, are filtered away, and the rate of the digital signal is decimated preferably N/2 times.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. Terms such as first, second, third, etc. are only descriptive terms and are not to be interpreted to have any order in relation to each other or other entities unless explicitly stated.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying FIGS. 3-12, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 3:
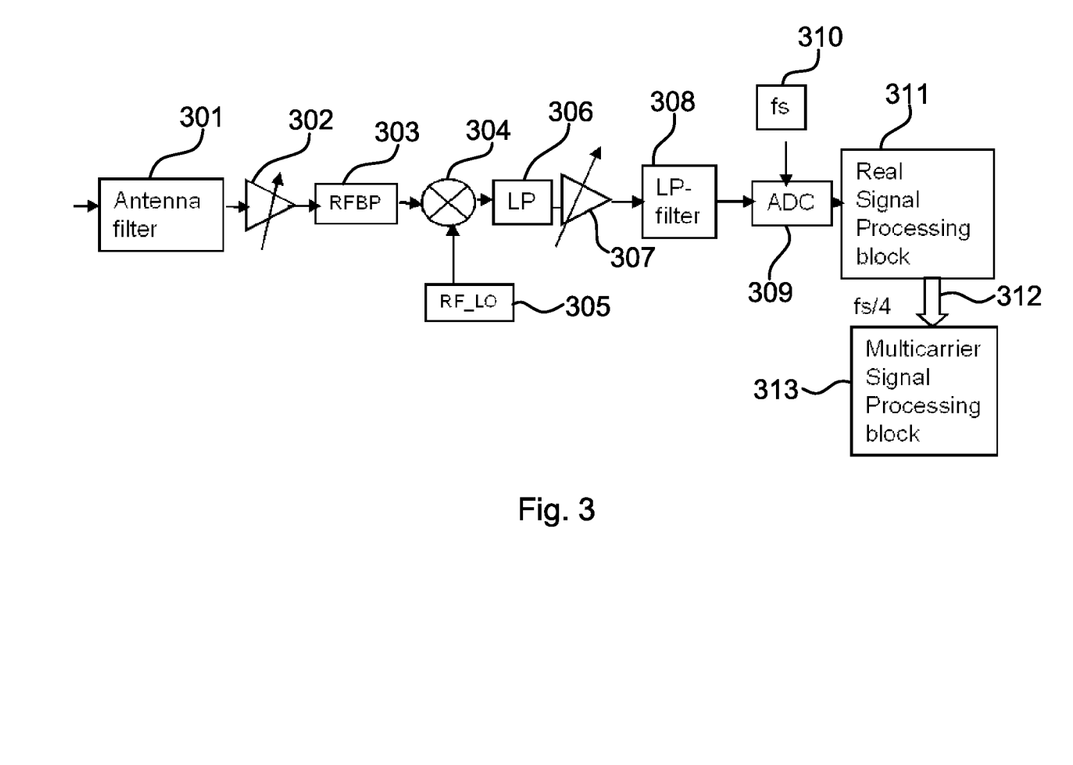
FIG. 3 is a block diagram of a super-heterodyne receiver according to one embodiment of the invention, wherein N=8.

FIG. 3 is a block diagram of a super-heterodyne receiver with single analogue conversion in accordance with an embodiment of the invention. The receiver comprises an antenna filter 301 arranged to filter an incoming analogue radio frequency (RF) signal, a low noise amplifier 302 arranged to amplify the incoming analogue RF signal, an RF band pass filter 303 operating as an intermediate frequency (IF) image reject filter to filter the amplified analogue RF signal, a frequency conversion block or mixer 304, which by aid of an oscillator 305 that provides the local oscillator frequency, is arranged to down convert the filtered analogue RF signal to an analogue IF signal, a low pass filter block 306-308 comprising two low pass filter 306, 308 and an amplifier 307 arranged therein between, and arranged to low pass filter and amplify the analogue IF signal, an analogue-to-digital converter (AD converter) 309 driven by a sampling clock 310 and arranged to convert the analogue IF signal to a digital signal 311 by using a sampling frequency fs which is at least eight times the maximum bandwidth of the filtered analogue IF signal, a digital signal or real signal processing block 311 arranged to filter, and to decimate the rate of, the digital signal, wherein the digital signal 312 output from the real signal processing block 311 is preferably similar to the digital signal 111 output from the AD converter 109 of the receiver of FIG. 1. Further, the receiver of FIG. 3 comprises a multicarrier signal processing block 313 arranged to convert the filtered digital signal to I- and Q-components to access a message in the incoming RF signal. A person skilled in the art realizes that the bandwidth of the filtered analogue IF signal mentioned should be somewhat smaller than N because of the digital filter slopes in the digital signal processing block 311.

By the antenna filter 301 the desired radio frequency band is selected. The low noise amplifier 302 arranged to amplify the incoming analogue RF signal may have possibilities for analogue gain adjust, both fast (nanoseconds range) for analogue gain correction (AGC) and slow (millisecond range) for gain adjust, or only one of the gain correction types. This indicated by the arrow shown on block 302. The band pass filter 303 operates as an image reject filter for the following frequency conversion block 304. The low noise amplifier 302 and the RF band pass filter 303 may interchange positions in the receiver if the amplifier gain is so low that the image rejection noise levels can be tolerated in the following frequency conversion block 304. The amplifier 307 has possibilities to adjust the gain of the analogue IF signal, both fast for AGC and slow for IF gain adjust, or only one of the gain correction types. This is indicated by the arrow on block 307.

The AD converter block 309 may comprise an oversampling AD converter or an interleaved AD converter arrangement.

By the provisions of the high sampling frequency AD converter block 309 and the digital signal processing block 311 arranged to filter, and decimate the rate of, the digital signal, the requirements on the filter block 306-308 can be greatly reduced as compared to prior art. Instead of an expensive band pass filter block with sharp edges that requires tuning, a much simpler analogue low pass filter block 306-308 with less stringent slope can be used as will be seen below.

Figure 4A:
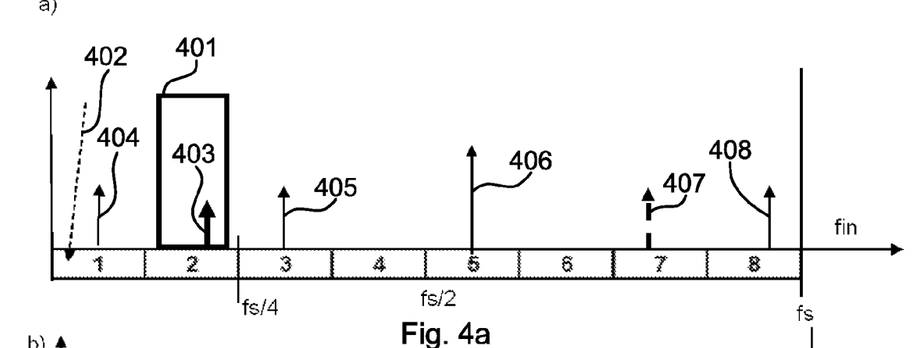
FIGS. 4a-c are frequency zone diagrams related to the operation of the receiver of FIG. 3.
Figure 4B:
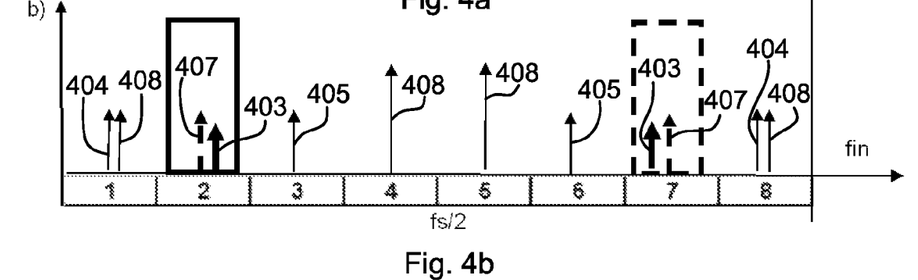
Figure 4C:
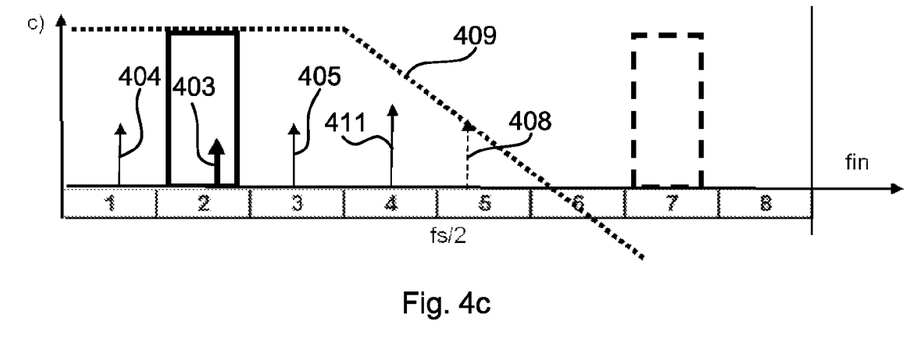

FIGS. 4a-c are frequency zone diagrams related to the operation of the receiver of FIG. 3 using N=8. The frequency spectrum from zero to the sampling frequency fs is divided into eight frequency zones 402, numbered from 1 to 8, each having a bandwidth which equals or is somewhat larger than the maximum bandwidth of the analogue IF signal. The frequency zones correspond to Nyquist zones of a fundamental AD converter operating with fs/4 sampling frequency.

FIG. 4a shows real input signals to the AD converter block 309. The desired analogue IF signal is denoted by 403 and is located within an IF frequency range 401 in the second frequency zone. Undesired signals 404-408 are shown in different frequency zones.

FIG. 4b shows real output digital signals from the AD converter block 309 if no analogue filtering is made by the filter block 306-308. The real AD converter output signal comprise the real input signals to the AD converter block 309 and their mirror images as mirrored in half the sampling frequency fs/2. The mirror images are each indicated by the reference numeral of the signal from which it emerges. In the IF frequency range 401 of the second frequency zone, the desired input signal 403 and the mirror image 407 emerging from the undesired signal 407 in the seventh frequency zone are found.

FIG. 4c shows real output digital signals from the AD converter block 309 if prior analogue filtering is made by the filter block 306-308 having filtering characteristics as shown by 409. Since undesired signals in the seventh and eight frequency zones, i.e. undesired signals 407 and 408 are filtered away, no mirror images will occur in the desired AD converter frequency response in the range 401 of the second frequency zones. The undesired signal 408 in the fifth frequency zone will be mirrored into the fourth frequency zone. By use of a filter block 306-308 with the low pass filter slope 409 there is no signal that can be folded back into the desired range 401 of the second frequency zone. By comparing the slope 409 of the low pass filter block 306-308 with the required slope 210 of the band pass filter block 106-108 for the AD converter 109 used in the prior art receiver of FIG. 1, it can be seen that the requirements of the filter block 306-308 is quite less stringent.

In order for the receiver of FIG. 3 to operate properly, the frequency conversion block 304 has to be arranged to convert the incoming analogue RF signal to the analogue IF signal such that the analogue IF signal is located in any of the three frequency zones of FIGS. 4a-c having lowest frequency, i.e. in any of the first to third frequency zones, and the filter block 306-308 has to arranged to low pass the analogue IF signal such that any undesired or disturbing signal is located in a frequency zone, which would have a mirror image after the AD conversion in the frequency zone, in which the desired analogue IF signal is located, is filtered away.

The remaining undesired signals or mirror images thereof 404, 405, 411, and 408 are filtered away in the digital signal processing block 311.

Figure 5:
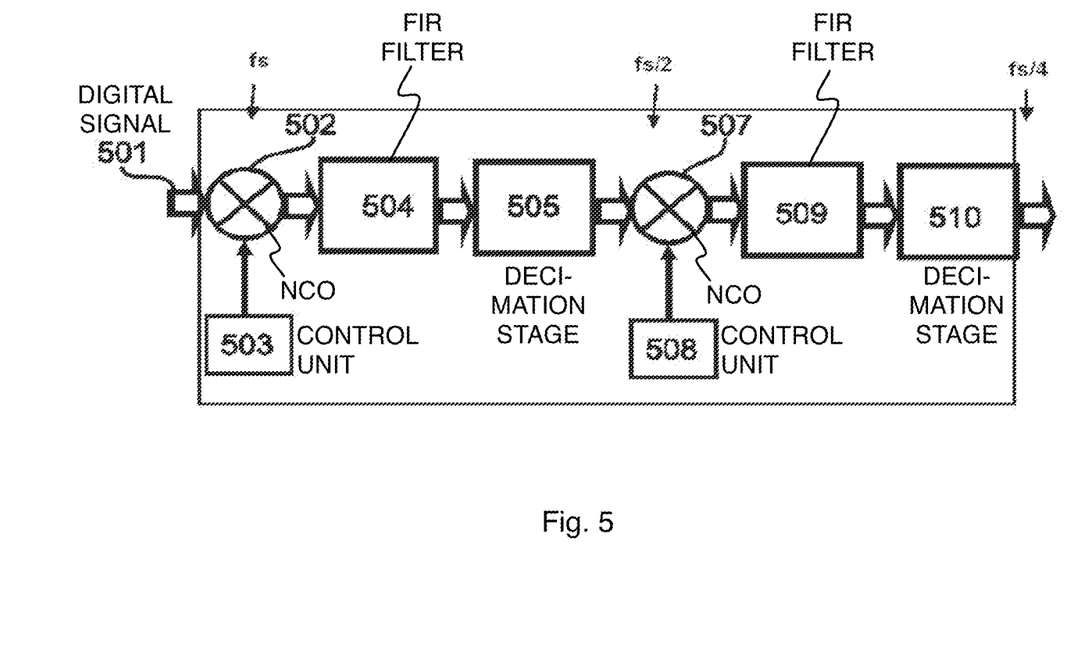
FIG. 5 is a block diagram of a digital signal processing block comprised in the receiver of FIG. 3.

The digital signal processing block 311 is shown in a block diagram in FIG. 5 and comprises a first numerically controlled oscillator (NCO) multiplier 502, a first digital finite impulse response (FIR) filter 504, a first signal rate decimation stage 505, a second NCO multiplier 507, a second digital FIR filter 509, and a second signal rate decimation stage 510. Each of the NCO multipliers 502, 507 is operatively connected to a respective control unit 503, 508 by which the NCO multiplier 502, 507 can be enabled or disabled.

The operation of the digital signal processing block 311 as shown in FIG. 5 is described below with reference also to FIGS. 6a-c and 7a-c, which are frequency zone diagrams related thereto.

The first NCO multiplier 502 receives the digital signal, indicated by 501 in FIG. 5, output from the AD converter 309 and introduces a +/π phase step per sample, which has the same function as multiplying the sample with +1 and −1 on consecutive samples when enabled. When disabled, the first NCO multiplier 502 introduces no radian phase step per sample, which has the same function as just multiplying the samples with 1. This means that the NCO multiplier 502 moves the frequency zones by half of the incoming sampling rate when enabled. As the sampling rate is fs, the movement to frequencies less than zero, say −A, means that the spectrum will occur at fs−A at the output of the first NCO multiplier 502 in frequency domain. If the desired signal from the AD converter 309 is located in a range of the second frequency zone as illustrated in FIGS. 4a-c, or in a range of the first frequency zone, the first NCO multiplier 502 should be disabled.

Figure 6A:
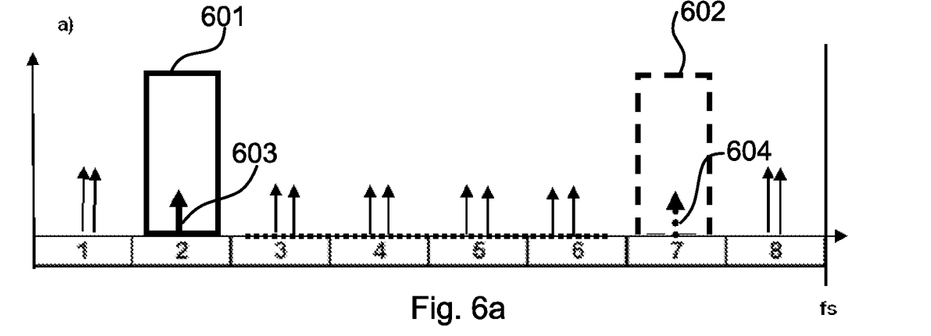
FIGS. 6a-c and 7a-c are frequency zone diagrams related to the operation of the digital signal processing block of FIG. 5.

The digital signal output from the AD converter 309 can be seen in the frequency zone diagram of FIG. 6a, which is identical with the signal output from the first NCO multiplier 502 when being disabled. The desired signal is indicated by 603 and is located in the range 601 in the second frequency zone. The mirror image is indicated by 604 and is located in the range 602 in the seventh frequency zone. Other undesired signals going through the low pass filter block 306-308 and mirror images thereof are indicated in the first, third to sixth, and eighth frequency zone.

Figure 6B:
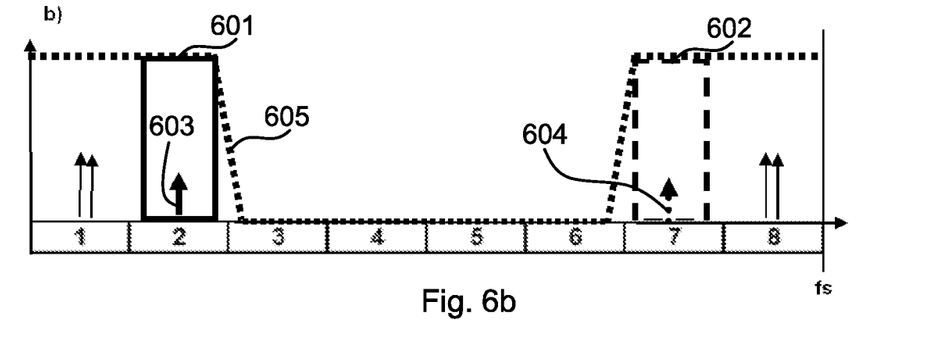

The first digital FIR filter 504 filters the signal output from the first NCO multiplier 502 with a FIR filter response as indicated as dashed line 605 versus frequency in the frequency zone diagram of FIG. 6b. Hereby, all undesired signals and mirror images thereof located in the third to sixth frequency zones are filtered away as shown in FIG. 6b.

Figure 6C:
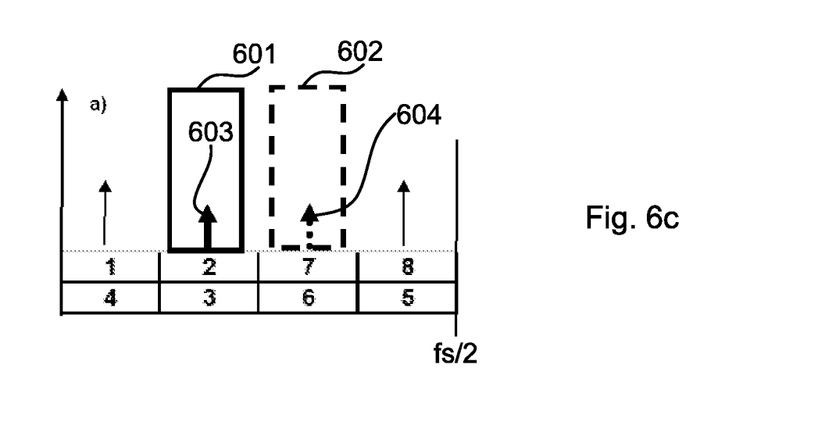

Next, the first signal rate decimation stage 505 decimates the signal output from the first FIR filter 504 to half the rate of the signal output from the AD converter 309. The resulting frequency zone diagram is shown in FIG. 6c wherein the original frequency zone numbers are indicated. The desired signal 603 and its mirror image 604 are now located in the second and third frequency zones. Undesired signals are still present in the first and fourth frequency zones.

Next the second NCO multiplier 507 in FIG. 5 is enabled and is thus arranged to move the spectrum ranges by −fs/4. The negative spectrum ranges will re-enter below fs/2 in the digital frequency domain as shown in the frequency zone diagram of FIG. 7a. The desired signal is indicated by 701 and its mirror image by 702. Undesired signals, now located in the second and third frequency zones are indicated by 703.

Figure 7A:
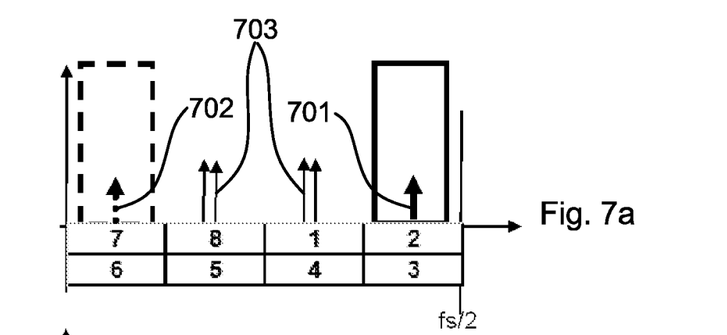
Figure 7B:
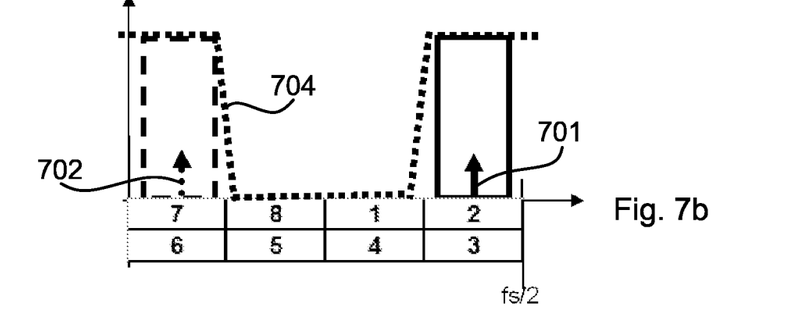

The second digital FIR filter 509 filters the signal output from the second NCO multiplier 507 with a FIR filter response as indicated as dashed line 704 versus frequency in the frequency zone diagram of FIG. 7b. Hereby, all undesired signals located in the second and third frequency zones are filtered away as shown in FIG. 7b.

Figure 7C:
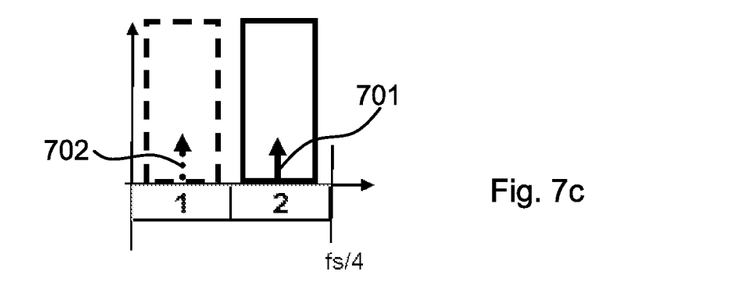

Finally, the second rate decimation stage 510 decimates the signal output from the second FIR filter 509 to one fourth of the rate of the signal output from the AD converter 309. The resulting frequency zone diagram is shown in FIG. 7c. The desired signal 701 and its mirror image 702 are now located in the first and second frequency zones and no undesired signals are present.

The four times decimated and filtered output signal from the digital signal block 311 is then input to the multicarrier signal processing block 313 of FIG. 3 for complex signal processing to obtain the I/Q signals.

A person skilled in the art will understand that the output signal shown in FIG. 7c is similar to the output signal shown in FIG. 2b of the prior art receiver of FIG. 1, which has an AD converter with four times lower sampling frequency fs/4. The high Q band pass filter required in the analogue domain of the prior art receiver of FIG. 1 is exchanged for a much more simple low pass filter with less steep slope of the frequency response and a digital signal processing block with digital FIR filtering in the digital domain. Depending on the used digital FIR-filters, the desired IF signal bandwidth may come close to 100% of a frequency zone bandwidth.

It shall be appreciated that the receiver structure of the invention can be practised in a number of further embodiments. Generally, a receiver structure of the invention may comprise a frequency conversion block arranged, by aid of a local oscillator, to convert an incoming analogue radio frequency (RF) signal to an analogue intermediate frequency (IF) signal; a filter block arranged to filter the analogue IF signal; and an analogue-to-digital (AD) converter block arranged, by aid of a sampling clock, to convert the filtered analogue IF signal to a digital signal, and a digital signal processing block, wherein the AD converter block is arranged to convert the filtered analogue IF signal to the digital signal by using a sampling frequency fs which is at least N times a maximum bandwidth of the filtered analogue IF signal, wherein the frequency spectrum from zero to the sampling frequency is divided into N frequency zones of equal width, wherein N is an even positive number higher than two;

the frequency conversion block is arranged with respect to the sampling frequency of the AD converter block to convert the incoming analogue RF signal to the analogue IF signal such that the analogue IF signal is located in any of the N/2-1 frequency zones having lowest frequency;

the filter block is arranged to low pass the analogue IF signal such that any disturbing signal located in a zone, which would have a mirror image after the AD conversion in the zone, in which the analogue IF signal is located, is filtered away; and the digital signal processing block is arranged to filter, and decimate the rate of, the digital signal, preferably such that disturbing signals located in any of the N frequency zones but the frequency zones, in which the digital signal and its mirror image are located, are filtered away, and to decimate the rate of the digital signal N/2 times, i.e. to a rate corresponding to the double frequency of the maximum bandwidth of the filtered IF signal.

In the embodiment of FIG. 1, N=8 and the analogue IF signal is located in the second one out of eight frequency zones. In alternative embodiments N=8, the analogue IF signal may lye in the first or third of the eight frequency zones. In the latter case the first NCO multiplier 502 should be enabled. In the former case and in the receiver structure of FIG. 1, the first NCO multiplier 502 could be dispensed with.

In another embodiment, N=4 wherein the analogue IF signal is located in the first one out of four frequency zones.

In yet another one, but possibly, less practical embodiment N=6.

In still other embodiments, N is larger than 8, and preferably a multiple.

In each embodiment, it is appreciated that a person skilled in the art is capable of designing and configuring the various blocks of the receiver, in particular the digital signal processing block.

The receiver technology disclosed above has possibilities to make very wide band receivers. The oversampled AD converter technique described in this invention with digital signal processing can utilize interleaved AD converters or AD converters with high sampling rate.

Figure 8:
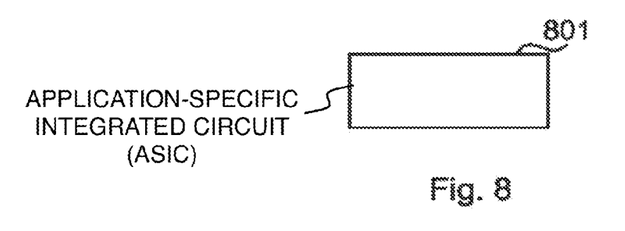
FIG. 8 illustrates, schematically an application-specific integrated circuit (ASIC) comprising parts of the a heterodyne receiver such as the one of FIG. 3.

In further embodiments, various blocks of the receiver of FIG. 3 or the general receiver structure operating with N frequency zones as disclosed above may be formed on a single chip in a single integrated circuit, such as an application-specific integrated circuit (ASIC) 801 as being schematically illustrated in FIG. 8.

For instance, in one embodiment, the filter block 306-308, or at least the second filter 308 or the amplifier 307 and the second filter 308, the AD converter block 309, and the digital signal processing block 311 are integrated into an ASIC.

In another embodiment, the frequency conversion block 304, the filter block 306-308, the AD converter block 309, and the digital signal processing block 311 are integrated into a single integrated circuit, preferably an ASIC.

In still another embodiment, the frequency conversion block 304, the filter block 306-308, the AD converter block 309, the digital signal processing block 311, and the multicarrier signal processing block 313 are integrated into a single integrated circuit, preferably an ASIC. Also the local oscillator 305 may be integrated into the ASIC.

Figure 9:
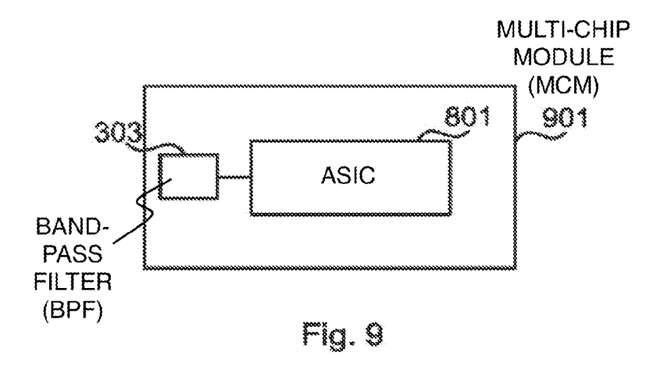
FIG. 9 illustrates, schematically a multi chip module (MCM) comprising an ASIC such as the ASIC of FIG. 8.

In yet another embodiment, parts of the receiver of FIG. 3 or the general receiver structure operating with N frequency zones as disclosed above may be formed in a multi chip module (MCM) 901 as being schematically illustrated in FIG. 9. The MCM 901 may thus comprise the ASIC 801 of FIG. 8, the RF band pass filter 303, and optionally the low noise amplifier 302 (not illustrated). Alternatively, the MCM 901 comprises further components outside of the ASIC 801.

Figure 10:
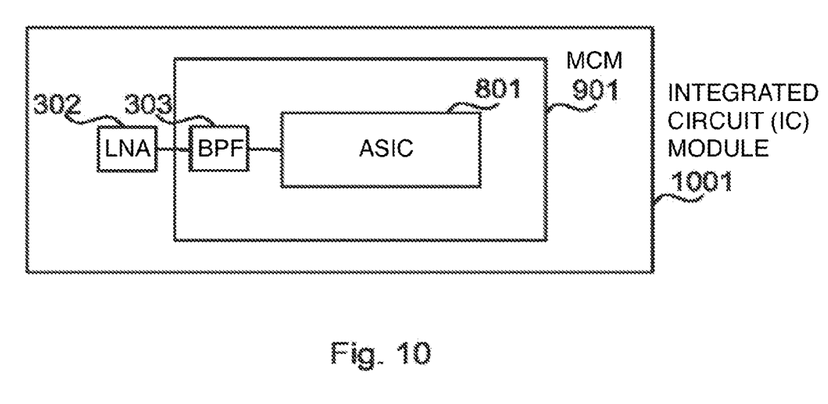
FIG. 10 illustrates, schematically a multi integrated circuit (IC) module comprising an MCM such as the MCM of FIG. 9.

In still another embodiment, parts of the receiver of FIG. 3 or the general receiver structure operating with N frequency zones as disclosed above may be formed in a multi integrated circuit (IC) module 1001 as being schematically illustrated in FIG. 10. While the multi IC module 1001 may comprise the ASIC of FIG. 8, the RF band pass filter 303, and optionally the low noise amplifier 302 (not illustrated), it comprises preferably the MCM 901 of FIG. 9 including the RF band pass filter 303, wherein the low noise amplifier 302 is arranged in the multi IC module 1001 externally to the MCM 901.

Figure 11:
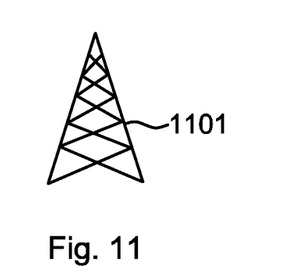
FIG. 11 illustrates, schematically a base station for a radio network comprising one or more of the receiver structure of FIG. 3, the ASIC of FIG. 8, the MCM of FIG. 9, and/or the multi IC module of FIG. 10.

In yet another embodiment, a base station 1101 for a radio network is provided as being illustrated in FIG. 11, wherein the base station comprises one or more of any of the receiver structures, the ASIC's, the MCM's, and/or the multi IC modules as being disclosed herein.

Figure 12:
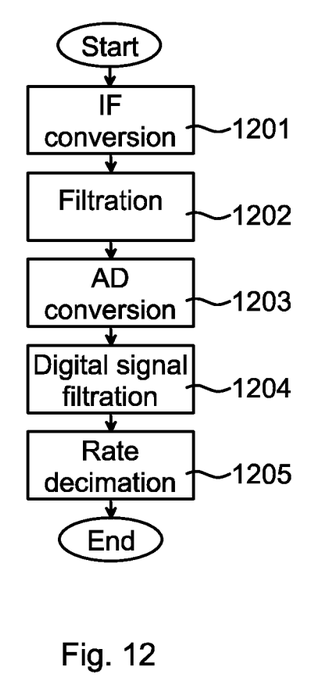
FIG. 12 is a flowchart of a method for processing a radio frequency signal according to one embodiment of the invention.

With reference next to FIG. 12, a method for processing a radio frequency signal according to one embodiment of the invention is described. The frequency spectrum from zero to a sampling frequency during AD conversion (see below) is divided into N frequency zones of equal width, wherein N is an even positive number equal to 4 or higher, and wherein each of the frequency zones is at least as wide as a maximum bandwidth of the filtered analogue IF signal.

An incoming analogue RE signal, e.g. from a radio antenna and via an antenna filter 301 such as the antenna filter 301 in FIG. 3, is, in a step 1201, converted to an analogue IF signal in such a manner that the analogue IF signal is located in any of the N/2-1 frequency zones of the N frequency zones having lowest frequency. The analogue IF signal is then, in a step 1202, filtered and optionally amplified. The filtration is a low pass filtration performed such that any disturbing signal located in a zone, which would have a mirror image after the AD conversion in the zone, in which the analogue IF signal is located, is filtered away.

The filtered analogue IF signal thereafter is, in a step 1203, converted to a digital signal using a sampling frequency, which is thus N times the maximum bandwidth of the filtered analogue IF signal. Finally, the digital signal is, in a step 1204, filtered, and the rate of the digital signal is, in a step 1205, decimated. Preferably, the digital signal is filtered such that disturbing signals located in any of the N frequency zones but the frequency zones, in which the digital signal and its mirror image are located, are filtered away, and the rate of the digital signal is decimated N/2 times.

In one embodiment N=8, wherein the analogue IF signal is located in any of the first to third frequency zones as disclosed above with reference to FIGS. 3-7.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A heterodyne receiver structure comprising:
   a frequency conversion block arranged, by aid of a local oscillator, to convert an incoming analog radio frequency (RF) signal to an analog intermediate frequency (IF) signal;
   a filter block configured to filter said analog IF signal;
   an analog-to-digital (AD) converter block arranged, by aid of a sampling clock, to convert said filtered analog IF signal to a digital signal; and
   a digital signal processing block configured to filter, and to decimate the rate of, the digital signal;
   wherein the AD converter block is configured to convert the filtered analog IF signal to the digital signal by using a sampling frequency that is at least N times a maximum bandwidth of the filtered analog IF signal, where the frequency spectrum from zero to the sampling frequency is divided into N frequency zones of equal width, with N being an even positive number higher than two;
   wherein the frequency conversion block is configured to convert the incoming analog RF signal to the analog IF signal such that the analog IF signal is located in any of the N/2-1 frequency zones having lowest frequency; and
   wherein the filter block is configured to low pass the analog IF signal such that any disturbing signal that is located in one of the N frequency zones and which would have a mirror image after the AD conversion in the frequency zone in which the analog IF signal is located is filtered away.

2. The heterodyne receiver structure of claim 1, wherein the digital signal processing block comprises at least one digital finite impulse response (FIR) filter, the at least one digital FIR filter being configured to filter said digital signal such that disturbing signals located in any of the N frequency zones except for those frequency zones in which the digital signal and its mirror image are located are filtered away.

3. The heterodyne receiver structure of claim 1, wherein the digital signal processing block comprises at least one signal rate decimation stage, the at least one signal rate decimation stage being configured to decimate the rate of the digital signal N/2 times.

4. The heterodyne receiver structure of claim 1, wherein the digital signal processing block comprises at least one numerically controlled oscillator (NCO) multiplier, the at least one NCO multiplier being configured to move the N frequency zones in the frequency spectrum.

5. The heterodyne receiver structure of claim 1, wherein the AD converter block comprises an N/2 times oversampling AD converter, or an interleaved AD converter arrangement.

6. The heterodyne receiver structure of claim 1, wherein N is a multiple of two.

7. The heterodyne receiver structure of claim 1, wherein the filter block comprises a first low pass filter, a second low pass filter, and an amplifier arranged therein between.

8. The heterodyne receiver structure of claim 1, wherein the filter block, the AD converter block, and the digital signal processing block are integrated into a single integrated circuit.

9. The heterodyne receiver structure of claim 1, wherein the frequency conversion block, the filter block, the AD converter block, and the digital signal processing block are integrated into a single integrated circuit.

10. The heterodyne receiver structure of claim 1, comprising a multicarrier signal processing block configured to receive the filtered and rate decimated signal from the digital signal processing block and to recover an I/Q modulation message in the filtered and rate decimated signal, wherein the frequency conversion block, the filter block, the AD converter block, the digital signal processing block, and the multicarrier signal processing block are integrated into a single integrated circuit.

11. The heterodyne receiver structure of claim 1, wherein the heterodyne receiver structure comprises part of a multi chip module (MCM) and wherein the frequency conversion block is configured to convert the incoming analog RF signal to the analog IF signal after the incoming analog RF signal is filtered by an RF band pass filter that is included in the MCM.

12. The heterodyne receiver structure of claim 7, wherein the second low pass filter, the AD converter block, and the digital signal processing block are integrated into a single integrated circuit.

13. The heterodyne receiver structure of claim 8, wherein the single integrated circuit further includes a low noise amplifier that is configured to receive the incoming analog RF signal after filtering from an RF band pass filter and wherein the frequency conversion block of the heterodyne receiver structure is configured to receive the incoming analog RF signal after amplification by the low noise amplifier.

14. The heterodyne receiver structure of claim 9, wherein the local oscillator is integrated into the single integrated circuit.

15. The heterodyne receiver structure of claim 11, wherein the MCM further includes a low noise amplifier configured to amplify the incoming analog RF signal, and wherein the frequency conversion block is configured to convert the incoming analog RF signal to the analog IF signal after amplification by the low noise amplifier.

16. The heterodyne receiver structure of claim 12, wherein the amplifier, the second low pass filter, the AD converter block, and the digital signal processing block are integrated into a single integrated circuit.

17. A method for processing a radio frequency signal comprising:
  converting an incoming analog radio frequency (RF) signal to an analog intermediate frequency (IF) signal;
  filtering said analog IF signal; and
  converting said filtered analog IF signal to a digital signal;
  wherein the filtered analog IF signal is converted to the digital signal by using a sampling frequency which is at least N times a maximum bandwidth of the filtered analog IF signal and where the frequency spectrum from zero to the sampling frequency is divided into N frequency zones of equal width, with N being an even positive number higher than two;
  wherein the incoming analog RF signal is converted to the analog IF signal such that the analog IF signal is located in any of the N/2-1 frequency zones having lowest frequency;
  wherein the analog IF signal is low pass filtered such that any disturbing signal located in a zone, which would have a mirror image after the AD conversion in the zone, in which the analog IF signal is located, is filtered away; and
  wherein the digital signal is filtered, and the rate of the digital signal is decimated.

18. The method of claim 17, wherein the digital signal is filtered such that disturbing signals located in any of the N frequency zones except for those frequency zones in which the digital signal and its mirror image are located are filtered away.

19. The method of claim 17, wherein the rate of the digital signal is decimated N/2 times.

* * * * *